United States Patent
Freitas et al.

(10) Patent No.: US 6,266,353 B1
(45) Date of Patent: Jul. 24, 2001

(54) MONOLITHIC LASER DIODE ARRAY WITH ONE METALIZED SIDEWALL

(75) Inventors: Barry L. Freitas; Jay A. Skidmore; John P. Wooldridge; Mark A. Emanuel, all of Livermore; Stephen A. Payne, Castro Valley, all of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/365,290

(22) Filed: Jul. 30, 1999

(51) Int. Cl.[7] .................................................. H01S 5/024
(52) U.S. Cl. ............................................................ 372/36
(58) Field of Search ........................................ 372/36, 50

(56) References Cited

U.S. PATENT DOCUMENTS

| | | | |
|---|---|---|---|
| 5,040,187 | * | 8/1991 | Karpinski ................................ 372/50 |
| 5,394,426 | * | 2/1995 | Joslin ...................................... 372/36 |
| 5,521,931 | * | 5/1996 | Biegelsen et al. ...................... 372/36 |
| 5,828,683 | * | 10/1998 | Freitas .................................... 372/36 |
| 5,930,279 | * | 7/1999 | Apollonov et al. ..................... 372/36 |
| 6,188,707 | * | 2/2001 | Irwin et al. ............................. 372/43 |

* cited by examiner

Primary Examiner—James W. Davie
(74) Attorney, Agent, or Firm—John P. Wooldridge; Alan H. Thompson

(57) ABSTRACT

A monolithic, electrically-insulating substrate that contains a series of notched grooves is fabricated. The substrate is then metalized so that only the top surface and one wall adjacent to the notch are metalized. Within the grooves is located a laser bar, an electrically-conductive ribbon or contact bar and an elastomer which secures/registers the laser bar and ribbon (or contact bar) firmly along the wall of the groove that is adjacent to the notch. The invention includes several embodiments for providing electrical contact to the corresponding top surface of the adjacent wall. In one embodiment, after the bar is located in the proper position, the electrically conductive ribbon is bent so that it makes electrical contact with the adjoining metalized top side of the heatsink.

50 Claims, 3 Drawing Sheets

MONOLITHIC LASER DIODE ARRAY WITH ONE METALIZED SIDEWALL

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to laser diode arrays, and more specifically, it relates to a low-cost laser diode array having laser diodes with precisely registered positions within a monolithic submount.

2. Description of Related Art

Laser diode arrays are used in a wide range of commercial, medical and military applications: materials processing (soldering, cutting, metal hardening), display technology/graphics, medical imaging and surgical procedures (corneal shaping, tissue fusion, dermatology, photodynamic therapy), satellite communication, remote sensing, and laser isotope separation. In certain solid-state laser applications it is desirable to use laser diode arrays to optically excite, ie., "pump," the crystal hosts. Diodes offer a narrow band of emission (reducing thermal lensing), compactness, high electrical efficiency and higher reliability as compared to flash lamps. Despite these numerous advantages, however, diode-pumped solid-state lasers (DPSSLs) have gained slow market acceptance due to the high cost associated with the laser diode array pumps. Significant diode array cost reductions would enable wide deployment of DPSSLs and new architectures to be realized that were previously cost prohibitive. In particular, low-cost diode arrays would bolster the inertial confinement fusion (ICF) and inertial fusion energy (IFE) programs that require low-repetition rate laser diode arrays in very high volumes.

Historically, much of the research and development in this area was devoted to solving diode material and fabrication issues in order to improve the yield and reliability of laser diodes. High quality InAlGaAs and InGaAsP laser diodes are now commercially available for pumping Nd:YAG at ~810 nm. As much as 100 W/cm of peak power is possible under pulsed operation, and over 10,000 hours of continuous operation (CW) in commercial systems has been demonstrated at reduced power levels (20–30 W CW). Although these types of performance improvements have led to cost reductions in the past, there has not been a complementary improvement in the packaging technology, which is now limiting further cost reductions from being achieved.

Most packaging/heatsink schemes use a "rack and stack" architecture. In this method, individual laser bars are fabricated into sub-assemblies, and the sub-assemblies are then bonded together to produce larger two-dimensional arrays. Labor intensive steps associated with handling individual components prevents the production of arrays in large volume and in high yield. To alleviate this problem, a "monolithic" fabrication approach known as "bars-in-grooves" was proposed. This process was commercialized by Laser Diode Array Inc. and it represents the only "monolithic" technology that is commercially available today. There are trade offs associated with using a monolithic technique (e.g. by LDA Inc.) and the salient issues are discussed below.

The grooves must be deliberately over-sized to facilitate mounting the bars (as well as to allow for a range of diode bar thicknesses). Accurate final placement of the laser bar is therefore difficult to achieve as solder is used to fill in the void left by the over-sized grooves. This prohibits accurate collimation (lensing) of the laser diodes which is desirable in "high-brightness" applications that are often used in "end-pumped" geometries. More importantly, flowing solder around the bars can damage, or short-out bars which lowers yield and represents a serious liability to packaging costs of a completed array. Either that, or the strict process controls and/or lower yield of "suitable" bars that is necessary poses a cost penalty with this soldering technique. The following invention improves upon the limitations of the former "bars-in-grooves" method, while still benefiting from being a monolithic or quasi-monolithic approach. The placement of the laser diodes is well defined, and the soldering process can be extremely well controlled, or not used at all, which ensures a high yield that is crucial for a low-cost high yield production of laser diode arrays.

U.S. Pat. No. 5,394,426 is directed to a low-cost diode laser bar assembly that increases peak power output and improves heat transfer and removal by using a thin, electrically insulating polyimide film-underneath the diode laser bar array. The exposed portions of the insulating film are metalized to allow indium solder bonding of the laser bar assembly to a heat sink. An interconnecting layer (between the metalization layer and the substrate) secures the diode laser bar assembly to the heat sink. This patent is not directed to a monolithic diode laser array that uses an electrically-conductive ribbon and sidewalls metalized on only one-side.

U.S. Pat. No. 5,284,790 and U.S. Pat. No. 5,040,187 are directed to the method of fabricating and the apparatus for a low-cost monolithic laser diode array, respectively. One or more grooves are formed on a monolithic substrate and the sidewall of the groove(s) is metalized. Laser diodes can be placed into the grooves by using a flexible monolithic substrate that can be bent just long enough to insert the laser diode. The force of the metalized walls of the groove holds the laser diode bar in place. Alternatively, a larger metalized groove can be made, and the laser diode can be inserted and held in place by some type of bonding/adhesive substance. These patents are not directed to a monolithic diode laser that uses an electrically-conductive ribbon U.S. Pat. No. 5,040,187 describes a method for flexing the substrate in order to facilitate loading laser bars. However, both the groove width and diode bar thickness must be controlled to such a high level of accuracy that this approach appears to be impractical. The present invention allows a practical implementation because individual elastomers can accommodate any thickness variations of the individual components.

U.S. Pat. No. 5,357,536 is directed to the method and the apparatus for positioning laser diodes. Parallel structures, at preset intervals, are made on the surface of the heatsink. The diode lasers, which have raised waveguides attached to their surfaces, are placed on the heatsink such that the waveguides are abutting the parallel structures. The laser diodes can then be permanently attached to the heatsink. This patent is not directed to a monolithic diode laser array that uses metalized sidewalls and an electrically-conductive ribbon.

U.S. Pat. No. 5,128,951 is directed to the method and the apparatus for a laser diode array that does not require separate metalization of the grooves in which the diode lasers are placed. One method is to bond/grow/plate a conductive layer to an electrically insulating or semi-insulating layer. Grooves are then cut or etched into the conductive layer. Alternatively, the upper portion of a substrate may be doped to make the substrate highly conductive.

The undoped, lower portions of the substrate are then nonconductive. This patent is not directed to a monolithic diode laser array that uses an electrically-conductive ribbon and is metalized by a single, angled evaporation.

U.S. Pat. No. 4,881,237 is directed to hybrid two-dimensional surface-emitting laser arrays. Edge-emitting lasers are placed into grooves in a highly heat-conductive substrate (Si or Cu). The grooves are made such that the sidewalls are at 45° angles. Microchannels can be made in the substrate to hold a cooling fluid. This patent is not directed to a monolithic diode laser array that uses an electrically-conductive ribbon and sidewalls metalized on only one-side.

SUMMARY OF THE INVENTION

A monolithic, electrically-insulating substrate that contains a series of notched grooves is fabricated. The substrate is then metalized so that only the top surface and one wall adjacent to the notch are metalized. Within the grooves is located a laser bar, an electrically-conductive ribbon, and an elastomer which secures/registers the laser bar and ribbon firmly along the wall of the groove that is adjacent to the notch. In one embodiment, after the bar is located in the proper position, the ribbon is bent so that it makes electrical contact with the adjoining metalized top side of the heatsink.

Commercial uses for the present invention include diode-pumped solid state lasers, remote sensing, EUV lithography, illuminators, display technology and medical applications (PDT, laser scalpel, hair removal, etc.). The present invention has governmental uses in the National Ignition Facility (NIF), IFE, EUV, illuminators, remote sensing, display and medical.

The array is formed from a monolithic substrate having a high thermal conductance and is electrically insulating. The notch provides a break in the subsequently deposited metal layer so that the laser bar is not electrically shorted. A metalization layer is applied to the substrate to provide electrical continuity between the adjacent laser bars that will be placed therein. Electrodes and a backplane heatsink are soldered to the submount. Note that this step can be deferred until later. The electrodes may be a single point on each side of the submount or may cover the entire side of the submount to provide more uniform electron distribution. The laser bars are placed in the grooves and an electrically-conductive ribbon or contact bar is placed next to each laser bar, followed by an elastomer which contacts the back-side of the ribbon to the opposite wall of the groove. The elastomer has no other unique quality except that it provides restoring force against the diode, and is not necessarily electrically conductive. The diode bars and ribbons are fused together and the diode bar is fused to the metalized sidewall of the groove at elevated temperatures.

The invention includes several embodiments for providing electrical contact to the corresponding top surface of the adjacent wall. One embodiment uses an electrically conductive ribbon that is longer than the laser bar and is flexible. Another embodiment uses a conductive metal shim to make electrical contact from a contact bar to the adjoining top metallic layer. Alternatively, the electrically-conductive contact bar is wire bonded to the metalized top of the substrate.

DETAILED DESCRIPTION OF THE INVENTION

A monolithic substrate is used to fabricate a low-cost laser diode array. An electrically-insulating substrate that contains a series of notched grooves is fabricated. The substrate is then metalized at an angle so that only the top surface and one wall adjacent to the notch are metalized. The groove depth is approximately equal to the bar's cavity length, and the groove is wide enough to contain a laser bar, an electrically-conductive ribbon, and an elastomer which secures/registers the laser bar and ribbon firmly along the wall of the groove that is adjacent to the notch. After the bar is located in the proper position, the ribbon is bent so that it makes electrical contact with the adjoining metalized top side of the heatsink. The diode array is then heated so that the thin-film solder located on the given components will reflow to ensure a reliable electrical contact between the subcomponents.

Figure 1:
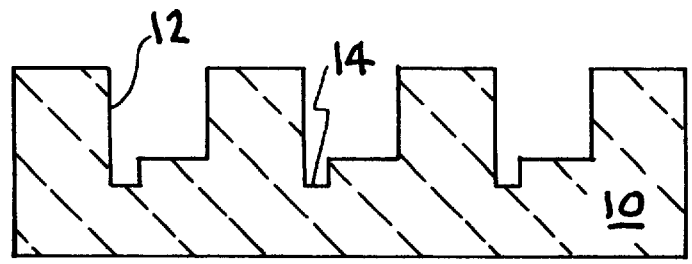
FIG. 1 shows an embodiment of a machined substrate of the present invention.

Referring to FIG. 1, the array is formed from a monolithic substrate 10. The substrate should have a high thermal conductance (such as BeO or Si) and be electrically insulating. The dimensions listed below are provided to give a better understanding of the invention. The thickness of the substrate is slightly longer than the laser cavity length (e.g., ~400 to 1000 $\mu$m). At least one groove 12 is formed in one embodiment by sawing the substrate (and the depth of the groove is approximately equal to the laser bar cavity length. Alternatively, the groove 12 can be etched (particularly suitable for Si substrates). A smaller groove 14 (or notch 14), which is thinner than the bar (usually <100 $\mu$m), is located at the bottom of the large groove and it extends ~100 $\mu$m past the large groove. The notch 14 provides a break in the subsequently deposited metal layer so that the laser bar is not electrically shorted. The pitch density (i.e., spacing between the notched grooves) can be varied and many arrays can be fabricated from the same initial substrate, for ease of handling.

Figure 2:
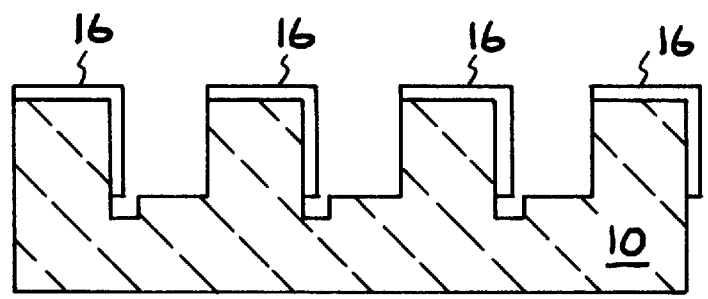
FIG. 2 shows the machine substrate of FIG. 1 after a metalization layer has been applied.

Referring to FIG. 2, a metalization layer 16 is applied to the substrate 10 to provide electrical continuity between the adjacent laser bars that will be placed therein. The metalization method, type, and layer thickness are not critical to this invention. Front-side metalization is accomplished by using a single, angled evaporation so that there is metal deposited exclusively on the top surface and sidewalls that contain the notch. A thin layer of metal, such as Ti or Cr (~50 nm), is usually evaporated first to provide good adhesion to the substrate 10. A thick layer (~10 μm) of highly electrically conductive material (such as Ag or Cu) is followed by another metal layer (such as In ~5 μm thick). The metal used in this layer, which acts as a solder, has a low melting point.

Figure 3:
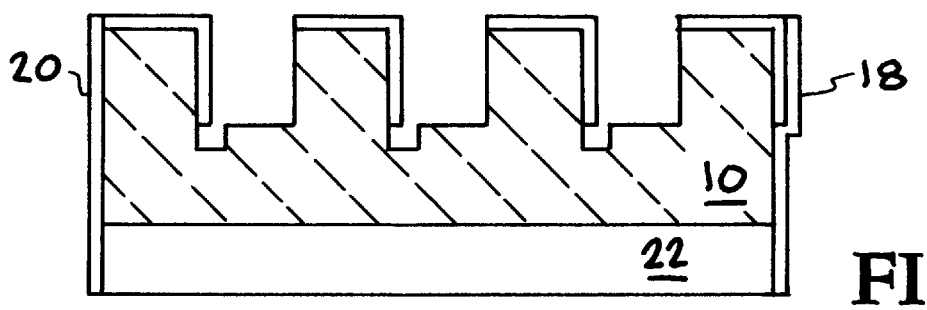
FIG. 3 shows the metalized substrate of FIG. 2, on which a backplane heatsink and side electrodes are soldered.

Referring to FIG. 3, electrodes 18 and 20 and a backplane heatsink 22 (e.g., copper with water channels) are soldered to the submount. Note that this step can be deferred until later. The electrodes may be a single point on each side of the submount or may cover the entire side of the submount to provide more uniform electron distribution.

Figure 4:
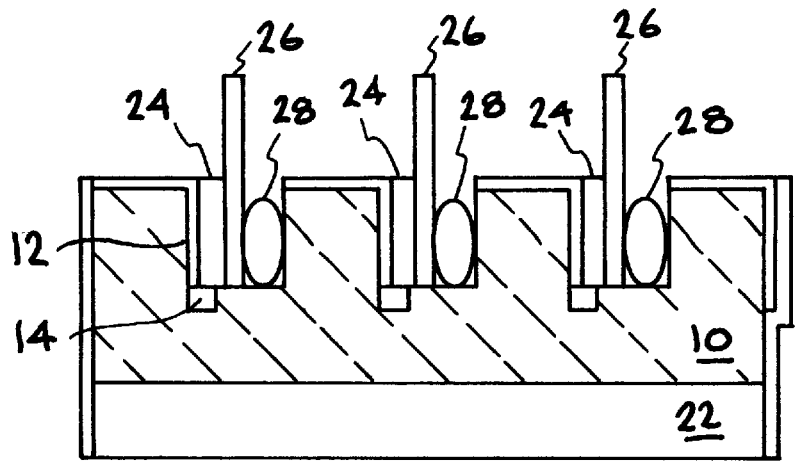
FIG. 4 shows the placement of the components of the present invention within the submount of FIG. 3.

As shown in FIG. 4, the laser bars 24 are now placed in the grooves 12 with the front-side (i.e., nearest p-n junction) in contact with the wall adjacent to the notched groove 14. An electrically-conductive ribbon 26 or contact bar 26 (with similar dimensions to the adjacent laser bar), is placed next to each laser bar, followed by an elastomer 28 or spring 28 which contacts the back-side of the ribbon to the opposite wall of the groove. The elastomer has no other unique quality except that it provides restoring force against the diode, and is not necessarily electrically conductive. (Some examples of elastomers/springs include rubber, silicone, a fluorocarbon, a thinly-bent sheet metal, or a metallic or nonmetallic spring). The diode bars and ribbons are fused together and the diode bar is fused to the metalized sidewall of the groove at elevated temperatures (solder melting point).

Figure 5A:
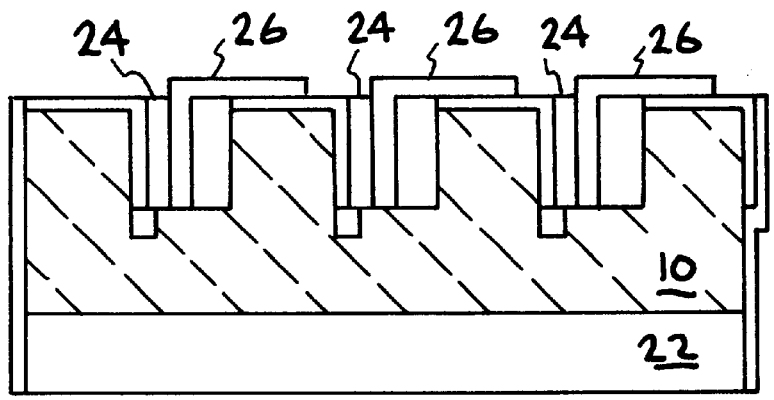
FIG. 5A shows the creation of electrical contact between the ribbon and the corresponding top surface of the adjacent wall by bending the ribbon until it makes contact with the adjacent top surface and then soldering the two surfaces.
Figure 5B:
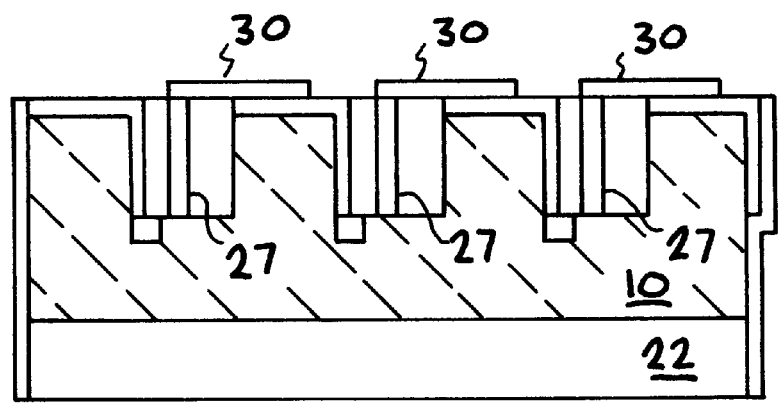
FIG. 5B shows the creation of electrical contact between the contact bar and the corresponding top surface of the adjacent wall by using a metal shim.
Figure 5C:
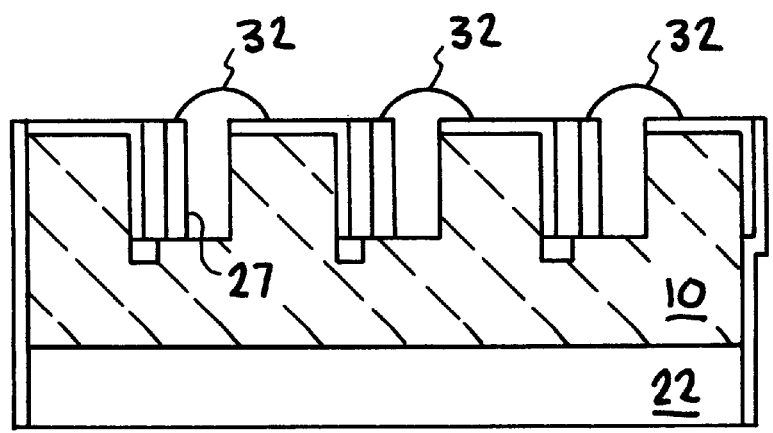
FIG. 5C shows the creation of electrical contact between the contact bar and the corresponding top surface of the adjacent wall by using wire bonding.

Electrical contact is made to the corresponding top surface of the adjacent wall. There are various ways to accomplish this task; however, the method illustrated in FIG. 5A is believed to simplify the manufacturing process. In the figure, the ribbon 26 is longer than the laser bar 24 and is flexible (e.g., copper sheet metal) as described above. In general the ribbon 26 must be malleable and electrically conductive. The ribbon 26 is bent so that it makes contact with the top metalized surface of the adjoining wall. The diode array is then heated again to allow soldering of the two surfaces. The elastomer may or may not be removed (although it is usually preferable to remove it). Alternatively, FIG. 5B shows the use of a conductive metal shim 30 (which may have a surface that includes a layer of In) which makes electrical contact from the contact bar 27 to the adjoining top metallic layer. Alternatively, FIG. 5C illustrates the use of wire bonding of the electrically-conductive contact bar 27 to the metalized top of the substrate to perform this function In FIG. 5C, contact bar 27 is electrically connected to the adjoining top metallic layer with wire bonds 32. In this case, a Au layer is usually deposited on both surfaces (the edge of the contact bar, and top metallization layer) in order to facilitate effective wire bonding. For the approaches shown in FIGS. 5A–C, the steps illustrated in FIGS. 1–4 remain the same.

Figure 6:
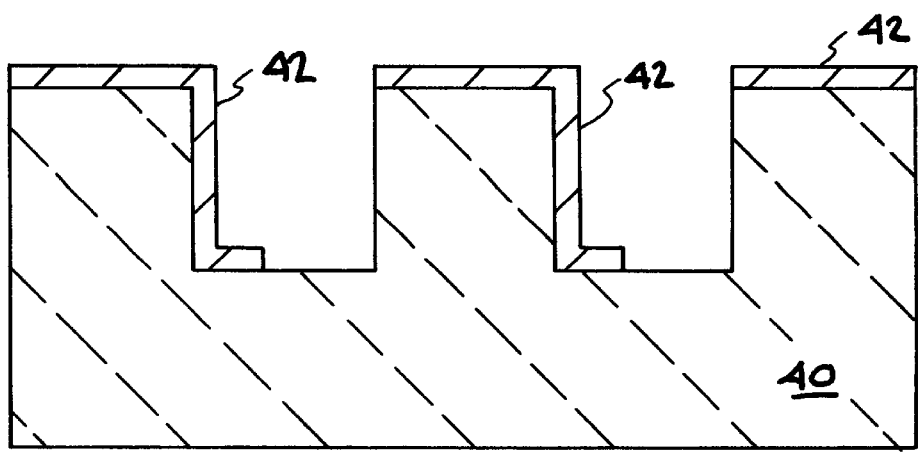
FIG. 6 shows the substrate and the metalization layer of an embodiment.
Figure 7:
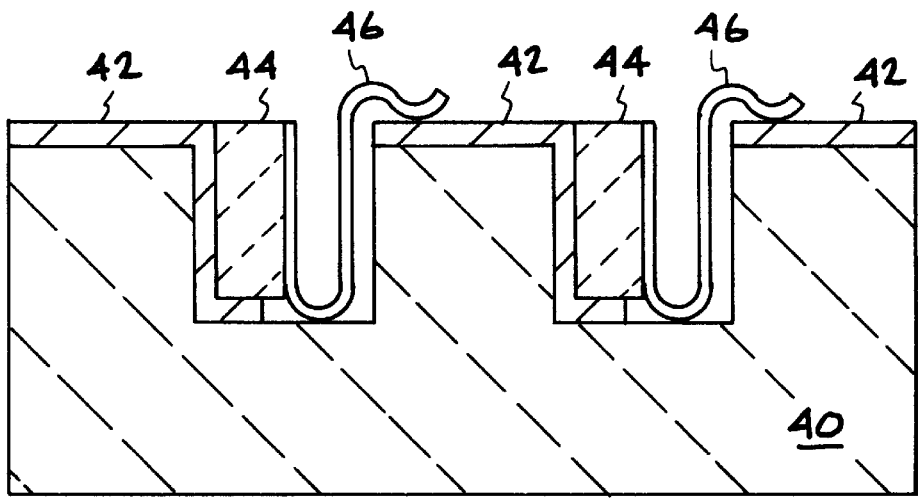
FIG. 7 shows the substrate with the addition of a laser diode bar and a spring made of electrically conducting material.
Figure 8:
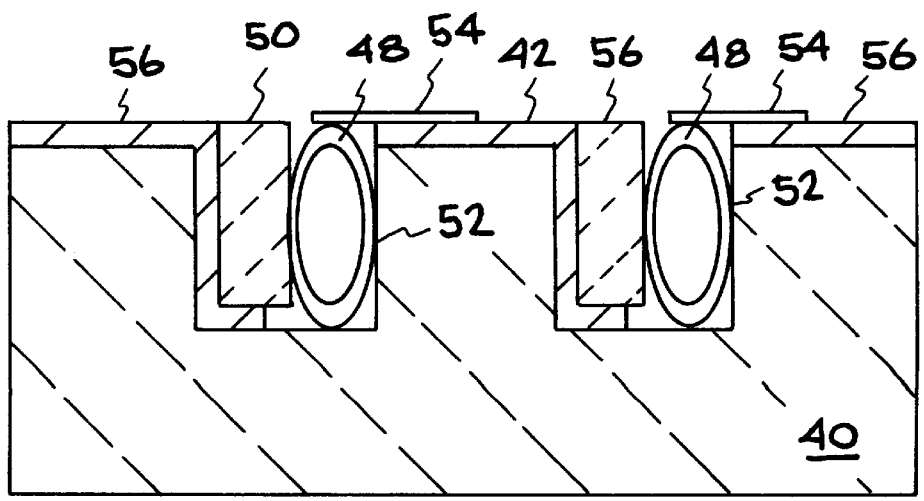
FIG. 8 shows the spring in tubular form.

FIG. 6 shows the substrate 40 and the metalization layer 42 of another embodiment. The partial metalization on the bottom of the slot need not be present but may result incidentally depending on the deposition technique. Substrate 40 may be formed from a single piece of material, or from two or more layers of material bonded together. The notch, as described in the embodiments shown above, may or may not be present. Two slots are shown, but the invention applies to one or many slots. Slots having walls that are perpendicular to the surface of the substrate are illustrated, but the invention applies as well to slots having walls not perpendicular to the surface. FIG. 7 shows the substrate with the addition of a laser diode bar 44 and a spring 46 made of electrically conducting material. The spring provides electrical continuity between the laser diode bar 40 and the metalization layer 42. The spring may take other forms, such as the tubular spring 48 shown in FIG. 8 between the laser diode 50 and the substrate wall 52. The embodiment of FIG. 8 includes a piece of conducting material 54 placed between the conducting spring 48 and the metalization layer 56.

Changes and modifications in the specifically described embodiments can be carried out without departing from the scope of the invention, which is intended to be limited by the scope of the appended claims.

The invention claimed is:

1. A monolithic laser diode array, comprising:
   a substrate having a top and at least one groove extending from said top into said substrate, wherein each groove of said at least one groove comprises a first sidewall, a second sidewall and a trough portion between said first sidewall and said second sidewall;
   a continuous metalization layer affixed to said top and said first sidewall, wherein said top and said first sidewall are electrically connected, wherein said metalization layer is not affixed to said second sidewall;
   a laser diode bar having a first relatively large area side and a second relatively large area side, wherein said first relatively large area side of said laser diode bar is in electrical contact with said continuous metalization layer on said first sidewall of said groove; and
   means for electrically contacting said second large area side of said laser diode bar with said continuous metalization layer on said top of said substrate that is adjacent to said second sidewall.

2. The monolithic laser diode array of claim 1, further comprising a notch portion in said trough portion, wherein said notch portion is located to be adjacent to said first sidewall.

3. The monolithic laser diode array of claim 1, wherein said means comprise:
   an electrically conducting contact bar having a first contact side and a second contact side, wherein said first contact side is in electrical contact with said second large area side of said laser diode bar; and
   means for electrically connecting said contact bar with said continuous metalization layer on said top of said substrate that is adjacent to said second sidewall.

4. The monolithic laser diode array of claim 3, further comprising means for indexing said contact bar to said laser diode bar and said laser diode bar to said continuous metalization layer affixed to said first sidewall.

5. The monolithic laser diode array of claim 4, wherein said means for indexing comprise an electrically conductive spring positioned between and providing a separating force between said second contact side and said second sidewall.

6. The monolithic laser diode array of claim 4, wherein said means for indexing comprise an nonconductive spring positioned between and providing a separating force between said second contact side and said second sidewall.

7. The monolithic laser diode array of claim 4, wherein said means for indexing comprise an elastomer positioned between and providing a separating force between said second contact side and said second sidewall.

8. The monolithic laser diode array of claim 4, wherein said means for indexing comprise rubber positioned between and providing a separating force between said second contact side and said second sidewall.

9. The monolithic laser diode array of claim 4, wherein said means for indexing comprise silicone-elastomer positioned between and providing a separating force between said second contact side and said second sidewall.

10. The monolithic laser diode array of claim 4, wherein said means for indexing comprise a fluorocarbon-elastomer positioned between and providing a separating force between said second contact side and said second sidewall.

11. The monolithic laser diode array of claim 4, wherein said means for indexing comprise a bent piece of metal positioned between and providing a separating force between said second contact side and said second sidewall.

12. The monolithic laser diode array of claim 1, wherein said substrate further comprises a first side and a second side, wherein said monolithic laser diode array further comprises a first side electrode electrically connected to said first side of said substrate and a second side electrode electrically connected to said second side of said substrate.

13. The monolithic laser diode array of claim 1, wherein said substrate further comprises a bottom, wherein said monolithic laser diode array further comprises a heatsink, wherein said heatsink is operatively connected to said bottom to allow thermal transfer from said substrate to said heatsink.

14. The monolithic laser diode array of claim 13, wherein said heatsink comprises water channels.

15. The monolithic laser diode array of claim 13, wherein said heatsink comprises copper.

16. The monolithic laser diode array of claim 1, wherein said laser diode bar comprises a p-n junction, wherein said p-n junction is positioned to be in contact with said first sidewall of said groove.

17. The monolithic laser diode array of claim 3, wherein said electrically conducting contact bar comprises material that is electrically conducting and malleable.

18. The monolithic laser diode array of claim 17, wherein said electrically conducting contact bar comprises an electrically conducting ribbon.

19. The monolithic laser diode array of claim 17, wherein said electrically conducting contact bar comprises an angled piece of metal.

20. The monolithic laser diode array of claim 3, wherein said means for electrically connecting said contact bar comprise an extended portion of said contact bar, wherein said extended portion is bent to touch said top of said substrate that is adjacent to said second sidewall.

21. The monolithic laser diode array of claim 3, wherein said means for electrically connecting said contact bar comprise an electrically conductive shim that is positioned to touch said contact bar and said top of said substrate that is adjacent to said second sidewall.

22. The monolithic laser diode array of claim 3, wherein said means for electrically connecting said contact bar comprise electrically conductive wire that is positioned to touch said contact bar and said top of said substrate that is adjacent to said second sidewall.

23. The monolithic laser diode array of claim 1, wherein said means for electrically contacting said second large area side of said laser diode bar with said continuous metalization layer on said top of said substrate that is adjacent to said second sidewall comprise a spring.

24. The monolithic laser diode array of claim 23, wherein said spring comprises a tubular shape.

25. A method for producing a monolithic laser diode array, comprising:
providing a substrate having a top and at least one groove extending from said top into said substrate, wherein each groove of said at least one groove comprises a first sidewall, a second sidewall and a trough portion between said first sidewall and said second sidewall;
producing a notch portion in said trough portion, wherein said notch portion is located to be adjacent to said first sidewall;
affixing a continuous metalization layer to said top and said first sidewall, wherein said top and said first sidewall are electrically connected;
providing a laser diode bar having a first large area side and a second large area side, wherein said first large area side of said laser diode bar is in electrical contact with said continuous metalization layer on said first sidewall of said groove;
providing an electrically conducting contact bar having a first contact side and a second contact side, wherein said first contact side is in electrical contact with said second large area side of said laser diode bar; and
electrically connecting said contact bar with said continuous metalization layer on said top of said substrate that is adjacent to said second sidewall.

26. The method of claim 25, further comprising indexing said contact bar to said laser diode bar and said laser diode bar to said continuous metalization layer affixed to said first sidewall.

27. A method for producing a monolithic laser diode array, comprising:
providing a substrate having a top and at least one groove extending from said top into said substrate, wherein each groove of said at least one groove comprises a first sidewall, a second sidewall and a trough portion between said first sidewall and said second sidewall;
providing a continuous metalization layer affixed to said top and said first sidewall, wherein said top and said first sidewall are electrically connected, wherein said metalization layer is not affixed to said second sidewall;
providing a laser diode bar having a first relatively large area side and a second relatively large area side, wherein said first relatively large area side of said laser diode bar is in electrical contact with said continuous metalization layer on said first sidewall of said groove; and
electrically contacting said second large area side of said laser diode bar with said continuous metalization layer on said top of said substrate that is adjacent to said second sidewall.

28. The method of claim 27, further comprising providing a notch portion in said trough portion, wherein said notch portion is located to be adjacent to said first sidewall.

29. The method of claim 27, wherein the step of electrically contacting said second large area side of said laser diode bar with said continuous metalization layer on said top of said substrate that is adjacent to said second sidewall comprises the steps of:
providing an electrically conducting contact bar having a first contact side and a second contact side, wherein said first contact side is in electrical contact with said second large area side of said laser diode bar; and
providing means for electrically connecting said contact bar with said continuous metalization layer on said top of said substrate that is adjacent to said second sidewall.

30. The method of claim 29, further comprising indexing said contact bar to said laser diode bar and said laser diode bar to said continuous metalization layer affixed to said first sidewall.

31. The method of claim 30, wherein the indexing step comprises positioning an electrically conductive spring providing a separating force between said second contact side and said second sidewall.

32. The method of claim 30, wherein said indexing step comprises positioning a nonconductive spring providing a separating force between said second contact side and said second sidewall.

33. The method of claim 30, wherein said indexing step comprises positioning an elastomer providing a separating force between said second contact side and said second sidewall.

34. The method of claim 30, wherein, wherein said indexing step comprises positioning rubber providing a separating force between said second contact side and said second sidewall.

35. The method of claim 30, wherein said indexing step comprises positioning silicone-elastomer providing a separating force between said second contact side and said second sidewall.

36. The method of claim 30, wherein said indexing step comprises positioning a fluorocarbon-elastomer providing a separating force between said second contact side and said second sidewall.

37. The method of claim 30, wherein said indexing step comprises positioning a bent piece of metal providing a separating force between said second contact side and said second sidewall.

38. The method of claim 27, wherein said substrate further comprises a first side and a second side, wherein said method further comprises further providing s a first side electrode electrically connected to said first side of said substrate and a second side electrode electrically connected to said second side of said substrate.

39. The method of claim 27, wherein said substrate further comprises a bottom, wherein said method further comprises providing said monolithic laser diode array with a heatsink, wherein said heatsink is operatively connected to said bottom to allow thermal transfer from said substrate to said heatsink.

40. The method of claim 39 wherein said heatsink comprises water channels.

41. The method of claim 39, wherein said heatsink comprises copper.

42. The method of claim 27, wherein said laser diode bar comprises a p-n junction, further comprising positioning said p-n junction to be in contact with said first sidewall of said groove.

43. The method of claim 29, wherein said electrically conducting contact bar comprises material that is electrically conducting and malleable.

44. The method of claim 29, wherein said electrically conducting contact bar comprises an electrically conducting ribbon.

45. The method of claim 29, wherein said electrically conducting contact bar comprises an angled piece of metal.

46. The method of claim 29, wherein said means for electrically connecting said contact bar comprise an extended portion of said contact bar, wherein said extended portion is bent to touch said top of said substrate that is adjacent to said second sidewall.

47. The method of claim 29, wherein the step of electrically connecting said contact bar comprises positioning an electrically conductive shim to touch said contact bar and said top of said substrate that is adjacent to said second sidewall.

48. The method of claim 29, wherein the step of electrically connecting said contact bar comprises positioning electrically conductive wire positioned to touch said contact bar and said top of said substrate that is adjacent to said second sidewall.

49. The method of claim 27, wherein the step of electrically contacting said second large area side of said laser diode bar with said continuous metalization layer on said top of said substrate that is adjacent to said second sidewall comprise positioning a spring between said laser diode bar and said second side wall.

50. The method of claim 27, wherein the step of electrically contacting said second large area side of said laser diode bar with said continuous metalization layer on said top of said substrate that is adjacent to said second sidewall comprise positioning a tubular spring between said laser diode bar and said second side wall.

* * * * *